United States Patent [19]
Mohwinkel

[11] Patent Number: 5,045,822
[45] Date of Patent: Sep. 3, 1991

[54] ACTIVE POWER SPLITTER
[75] Inventor: Clifford A. Mohwinkel, San Jose, Calif.
[73] Assignee: Pacific Monolithics, Sunnyvale, Calif.
[21] Appl. No.: 508,362
[22] Filed: Apr. 10, 1990
[51] Int. Cl.$^5$ .............................................. H03H 7/48
[52] U.S. Cl. ................................... 333/124; 333/100; 333/25; 307/571; 307/244; 307/513
[58] Field of Search .................... 333/100, 124, 25; 307/571, 244, 513

[56] References Cited

U.S. PATENT DOCUMENTS 4,580,114  4/1986  Upadhyayula ...................... 330/100

OTHER PUBLICATIONS

S. Cohn, "A Class of Broadband Three-Port TEM-Mode Hybrids", *IEEE Transactions on Microwave Theory and Techniques*, vol. MTT-16, No. 2, Feb. 1968, pp. 110–116.
Saleh, "Planar Electrically Symmetric n-Way Hybrid Power Dividers/Combiners", *IEEE Transactions on Microwave Theory and Techniques*, vol. MTT-28, No. 6, Jun. 1980, pp. 555–563.
Wahi, "Wideband, Unequal Split Ratio Wilkinson Power Divider", *Microwave Journal*, Sep. 1985, pp. 205–209.
Hanna et al., "A Wide-Band 12-GHz 12-Way Planar Power Divider/Combiner", *IEEE Transactions on Microwave Theory and Techniques*, vol. MTT-34, No. 8, pp. 896–897, Aug. 1986.
Madihian et al., "GaAs-Monolithic IC's for an X-Band PLL-Stabilized Local Source", IEEE Transactions on Microwave Theory and Techniques, vol. MTT-34, No. 6, Jun. 1986, pp. 707–713.
Bosisio, et al., "Computer-Aided Evaluation of Manufacturing Tolerances of an Optimized, Wideband Wilkinson Power Divider", *Microwave Journal*, Apr. 1987, pp. 155–166.
Wang et al., "Manufacturing Pass Rate Predictions of an Optimized 2 to 18 GHz Wilkinson Power Divider in Microstripline", *Microwave Journal*, Dec. 1987, pp. 115–122.
Hamadallah, "Microstrip Power Dividers at mm-Wave Frequencies", *Microwave Journal*, Jul. 1988, pp. 115–127.
Burgess, "Unequal Power Division with a Lumped Element Divider", *RF Design*, Jun. 1988, pp. 69–73.
Beckwith et al., "Wide Bandwidth Monolithic Power Dividers", *Microwave Journal*, Feb. 1989, pp. 155–160.
Kanazawa et al., "A 15Ghz Single Stage GaAs Dual-Gate FET Monolithic Analog Frequency Divider with Reduced Input Threshold Power", *IEEE 1988 Microwave and Millimeter-Wave Monolithic Circuits Symposium*, pp. 47–49.
Barta et al., "Surface-Mounted GaAs Active Splitter and Attenuator MMIC's Used in a 1–10GHz Leveling Loop", *IEEE Transactions on Microwave Theory and Techniques*, V. MTT-34, No. 12, Dec. 1986, pp. 1569–1575.
Barta et al., "A 2 to 8 GHz Leveling Loop Using a GaAs MMIC Active Splitter and Attenuator", *IEEE*, 1986, pp. 75–79.
Harvey et al., "A Low Noise GaAs MMIC Satellite Downconvertor for the 6 to 4 GHz Band", *IEEE MTT-S Digest*, 1987, pp. 233–236.

Primary Examiner—Eugene R. LaRoche
Assistant Examiner—Tan Dinh
Attorney, Agent, or Firm—Edward B. Anderson

[57] ABSTRACT

Input power is applied to an input inductor/capacitor combination. The gates of each of two FETs are connected to the other side of the input inductor. The source of each FET is connected to ground potential. The drain of the first FET is connected to a first output port, and the drain of the second FET is connected to a second output port. A signal input on the drain of one of the FETs is 180° out of phase with the same signal passing through the two FETs to the drain of the other FET. The gate and drain of the first and second FETs have series-connected resistance/inductance feedback networks to give input and output match. A series-connected isolation resistor and inductor are connected between the first and second output ports for feeding signals of reduced amplitude to offset signal feedback through the FETs.

5 Claims, 1 Drawing Sheet

ACTIVE POWER SPLITTER

FIELD OF THE INVENTION

This invention relates to power splitters having active elements and interport isolation impedance.

BACKGROUND AND SUMMARY OF THE INVENTION

Power dividers have been used for many years to divide a single input signal into two or more output signals. These output signals may or may not have the same power level. Historically, in microwave frequency applications, these dividers have been constructed of transmission lines of appropriate impedances. Examples are illustrated by Cohn in "A Class of Broadband Three-Port TEM-Mode Hybrids", *IEEE Transactions on Microwave Theory and Techniques*, Vol. MTT-16, No. 2, February 1968, pages 110-116; by Saleh in "Planar Electrically Symmetric n-Way Hybrid Power Dividers/Combiners", *IEEE Transactions on Microwave Theory and Techniques*, Vol. MTT-28, No. 6, June 1980, pages 555-563; by Wahi in "Wideband, Unequal Split Ratio Wilkinson Power Divider", *Microwave Journal*, September 1985, pages 205-209; by Hanna et al. in "A Wide-Band 12-GHz 12-Way Planar Power Divider/Combiner", *IEEE Transactions on Microwave Theory and Techniques*, Vol. MTT-34, No. 8, August 1986, pages 896-897; by Madihian et al. in "GaAs-Monolithic IC's for an X-Band PLL-Stabilized Local Source", *IEEE Transactions on Microwave Theory and Techniques*, Vol. MTT-34, No. 6, June 1986, pages 707-713; by Bosisio et al. in "Computer-Aided Evaluation of Manufacturing Tolerances of an Optimized, Wideband Wilkinson Power Divider", *Microwave Journal*, April 1987, pages 155-166; by Wang et al. in "Manufacturing Pass Rate Predictions of an Optimized 2 to 18 GHz Wilkinson Power Divider in Microstripline", *Microwave Journal*, December 1987, pages 115-122; and by Hamadallah in "Microstrip Power Dividers at mm-Wave Frequencies", *Microwave Journal*, July 1988, pages 115-127. These devices tend to provide high isolation, such as more than 20 dB, only over very narrow frequency ranges.

Isolation over somewhat broader bandwidths has been achieved while using less circuit area by forming the power dividers out of lumped elements. Two examples are Burgess, "Unequal Power Division with a Lumped Element Divider", *RF Design*, June 1988, pages 69-73; and Beckwith et al., "Wide Band Monolithic Power Dividers", *Microwave Journal*, February 1989, pages 155-160.

Active elements have also been used for frequency and power dividers. These are illustrated by Kanazawa et al. in "A 15 GHz Single Stage GaAs Dual-Gate FET Monolithic Analog Frequency Divider with Reduced Input Threshold Power", *IEEE 1988 Microwave and Millimeter-Wave Monolithic Circuits Symposium*, pages 47-49; by Barta et al. in "Surface-Mounted GaAs Active Splitter and Attenuator MMIC's Used in a 1-10 GHz Leveling Loop", *IEEE Transactions on Microwave Theory and Techniques*, Vol. MTT-34, No. 12, December 1986, pages 1569-1575, and in "A 2 to 8 GHz Leveling Loop Using a GaAs MMIC Active Splitter and Attenuator", *IEEE*, 1986, pages 75-79; and by Harvey et al. in "A Low Noise GaAs MMIC Satellite Downconverter for the 6 to 4 GHz Band", 1987 *IEEE MTT-S Digest*, pages 233-236.

Harvey et al. use a common-gate input stage and a common source output stage. Barta et al. use four common-source FET stages to split the input power between two output power sources to obtain over 24 dB isolation up to 9 GHz.

It is thus desirable to have a power splitter usable for MMIC applications that provides high isolation over a broad bandwidth. This is provided by an active power splitter made according to the present invention.

Generally speaking, this is provided by an active power splitter for splitting power input on an input port between first and second output ports. A pair of transistors are included. Each has a control terminal coupled, such as by electrical connection, to the input port, and two current-conducting terminals. One of the current-conducting terminals of each transistor is coupled to a reference voltage. The other current-conducting terminal of one transistor is coupled to the first output port, and the other current-conducting terminal of the other transistor is coupled to the second output port. A signal input on one of the output ports is out of phase with the same signal passing through the two transistors to the other output port. Impedance is coupled between the two output ports for feeding signals of reduced amplitude between the first and second output ports.

The preferred embodiment of the present invention comprises an input inductor coupled to the input port. A first and a second FET are provided. The gate of each FET is coupled to the input inductor. The source of each FET is coupled to ground potential. The drain of the first FET is coupled to the first output port, and the drain of the second FET is coupled to the second output port. A signal input on the drain of one of the FETs is approximately 180° out of phase with the same signal passing through the two FETs to the drain of the other FET.

First and second impedances couple the gate and drain of the first and second FETs, respectively. A series-connected isolation resistor and inductor are coupled between the first and second output ports for feeding signals of reduced amplitude between the first and second output ports.

Such a circuit provides inherent isolation between the two output ports through the two FETs. Further, a signal passing from one output port through the FETs to the other output port is found to undergo a 180° phase shift. Thus, by inserting a reduced signal without substantial phase change directly between the output ports, the signals become self-cancelling, thereby providing even greater isolation. These results are achieved in a single stage circuit that is readily implemented as an MMIC.

These and other advantages and features of the invention are apparent from the preferred embodiment disclosed in the following detailed description and the associated drawings.

DETAILED DESCRIPTION OF THE PREFERRED EMBODIMENT

Figure 1:
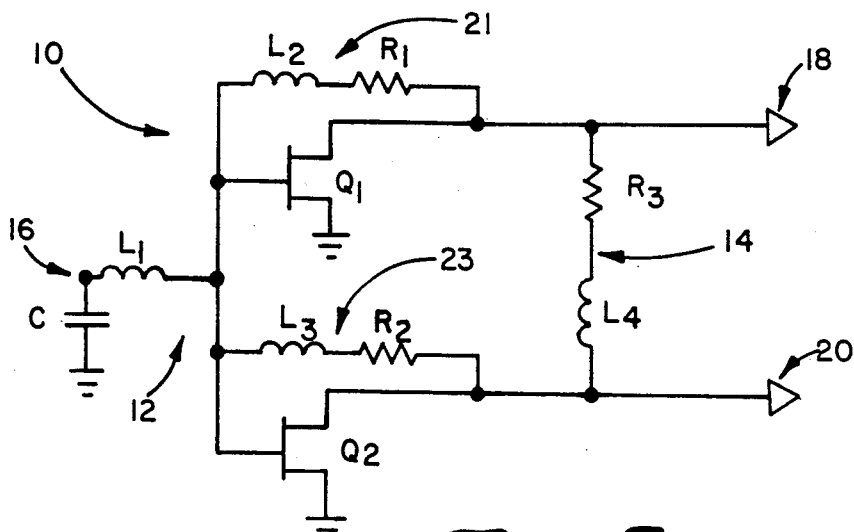
FIG. 1 is a circuit schematic of a power splitter made according to the present invention.

Referring initially to FIG. 1, an active power splitter 10 made according to the present invention is shown. Circuit 10 includes a power splitting subcircuit 12 and an output interport impedance 14. Power supplied on an input port 16 is coupled, such as by connection, to a reference voltage, such as circuit ground, through a capacitor C. The input port is also connected to the gates of two FETs Q1 and Q2 via a single input inductor L1. The grounded-source FETs have the respective drains connected to first and second output ports 18 and 20, as shown.

The drain and gate of each FET Q1 and Q2 are connected by feedback impedances 21 and 23. These impedances, consisting of series connections of resistor R1 and inductor L2, and resistor R2 and inductor L3, respectively, provide both input/output impedance matching and gain compensation, in conjunction with the associated FETs. Output ports 18 and 20 are directly connected by interport impedance 14 comprising, preferably resistor R3 and inductor L4 in series, as shown.

Isolation between ports 18 and 20 is a primary objective of power dividers or splitters. With the use of active devices, such as FETs Q1 and Q2, a return signal on an output port, say port 18, passes through FET Q1 by the capacitive divider between the drain and gate and between the gate and ground. This un-phase-shifted signal then feeds directly through the other FET Q2, and in doing so, undergoes approximately a 180° phase shift. This signal appears on the other output port 20. As shown in the prior art described, there is substantial degradation of this signal, measured as isolation.

Additional signal degradation occurs in splitter 10 through interport impedance 14. In the most simple form, this would consist of resistor R3. The signal on output port 18 is thus fed, without phase shift, through resistor R3 to output port 20. The same signal traveling on two different paths, one with 180° phase shift, and one without phase shift, is thus recombined at this output port. The two signal paths thus result in cancelling of the signal, producing thereby, substantial decrease in the resultant signal on output port 20.

It is found that the signal passing through the FETs does not change phase exactly by 180°. The offset in phase shift from 180° is compensated for by inductor L4, so that the two signals both have phase shift, with the net phase shift being 180°.

Figure 2:
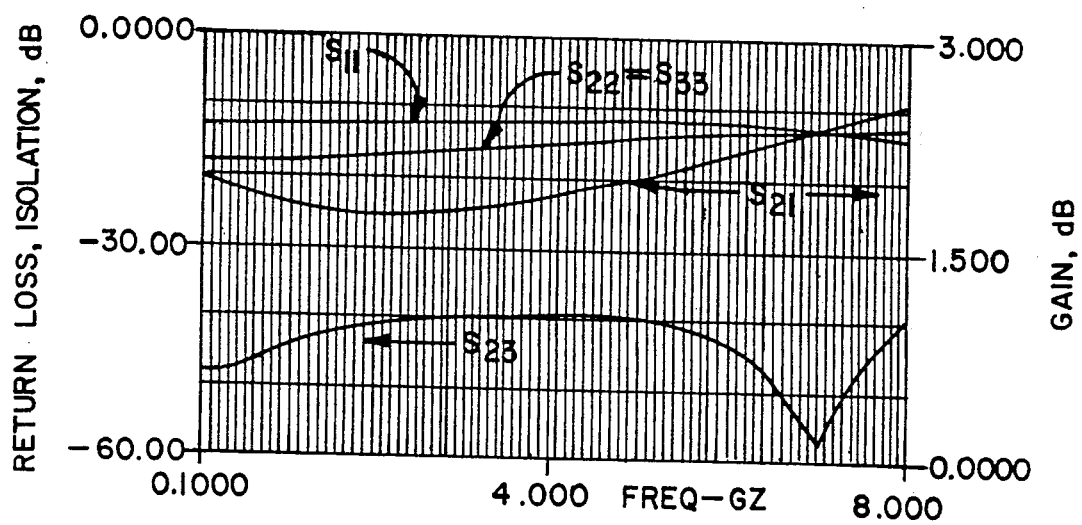
FIG. 2 is a plot of various signal magnitudes as a function of frequency for the splitter of FIG. 1.
Figure 3:
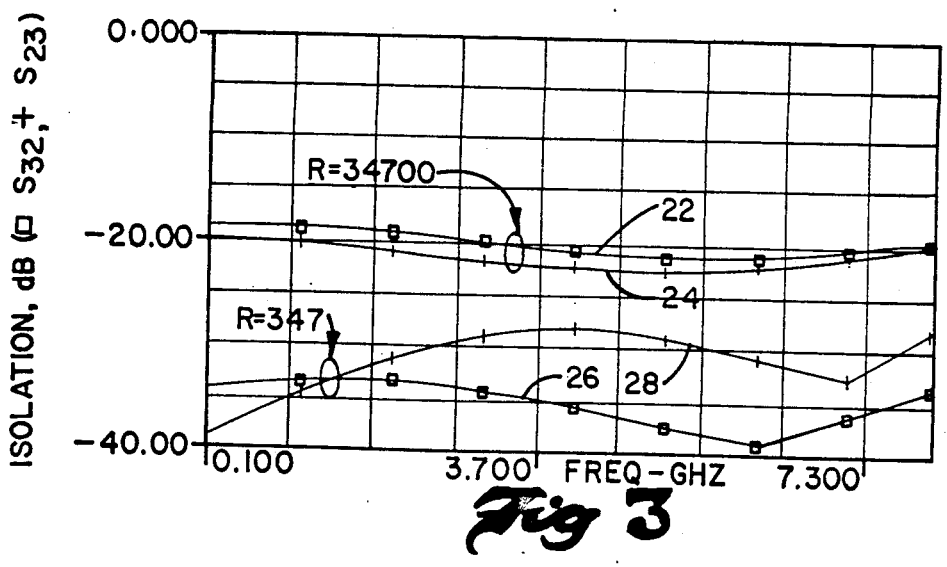
FIG. 3 is a plot of the isolation of a splitter made according to FIG. 1 for different isolation resistance values.

FIGS. 2 and 3 show the plot of representative circuit characteristics of two specific embodiments of splitter 10. The following Table 1 lists the values for the circuit components in the two cases.

TABLE 1

| COMPONENT | VALUES FIG. 2 (Symmetrical) | FIG. 3 (Asymmetrical) |
|---|---|---|
| C,pf | 0.36 | 0.51 |
| L1,nh | 0.71 | 0.97 |
| R1,ohms | 162 | 161 |
| L2,nh | 1.1 | 0.09 |
| R2,ohms | 162 | 927 |
| L3,nh | 1.1 | 0.89 |
| R3,ohms | 113 | 347/34700 |
| L4,nh | 3.8 | 0.75 |

Referring to FIG. 2, the return loss ($S_{nn}$) values, for a symmetrical splitter having component values as listed in Table 1, are seen to be below −10 dB over the frequency range 0.1–8.0 GHz. The gain ($S_{21}$) is generally between 1.5 and 2.5 for each port. However, the isolation exceeds −40 dB over the entire range.

FIG. 3 illustrates the isolation of an asymmetrical power splitter having component values as listed in Table 1. This is used typically in detector circuits, where a main signal is preserved on an output port and a sample of the signal is detected on the other output port. FIG. 3 also illustrates the effect of having interport impedance 14. The isolation for both output ports is shown. Curves 22 ($S_{32}$) and 24 ($S_{23}$) show the isolation between output ports 18 and 20 when the value of R3 is 34,700 ohms, or essentially open circuited. Curves 26 ($S_{32}$) and 28 ($S_{23}$) show the isolation between the output ports when the value of R3 is 347 ohms. In the former case, the isolation is about −20 dB. In the latter case, the isolation exceeds −28 dB for $S_{23}$ and −33 dB for $S_{32}$. In the case of a detector, the isolation of output port 18 (equivalent to port 2 in the plot designations) from signals input on port 20 is primarily important in order to keep the primary signal as clean as possible. It is seen that this has the greater isolation. Further, a general increase in isolation of −7 to −15 dB results from the existence of R3.

Table 2, following, shows detailed performance characteristics of the asymmetric splitter whose components are defined in Table 1.

TABLE 2

| Freq-GHz | s21, dB | s31, dB | s11, dB | s22, dB | s33, dB | s32, dB | s23, dB |
|---|---|---|---|---|---|---|---|
| 0.10000 | 6.130 | −1.459 | −25.807 | −10.502 | −5.051 | −34.016 | −38.705 |
| 1.10000 | 5.803 | −1.554 | −18.404 | −11.033 | −5.237 | −33.410 | −34.259 |
| 2.10000 | 5.625 | −1.681 | −14.301 | −11.733 | −5.360 | −33.093 | −30.900 |
| 3.10000 | 5.516 | −2.012 | −11.331 | −12.829 | −5.173 | −34.112 | −28.438 |
| 4.10000 | 5.445 | −2.172 | −10.819 | −13.530 | −5.195 | −35.344 | −28.140 |
| 5.10000 | 5.509 | −2.305 | −11.562 | −13.617 | −5.222 | −37.148 | −28.659 |
| 6.10000 | 5.576 | −2.268 | −14.277 | −12.714 | −5.184 | −38.751 | −30.425 |
| 7.10000 | 5.589 | −2.414 | −18.536 | −11.190 | −5.279 | −35.961 | −32.320 |
| 8.00000 | 5.444 | −3.457 | −9.420 | −10.506 | −5.349 | −33.272 | −27.875 |

Although the invention has been described with reference to a preferred embodiment, it will be understood by those skilled in the art that variations and changes in form and design may be made without varying from the spirit and scope of the invention as described in the claims.

We claim:

1. An active power splitter for splitting power input on an input port between first and second output ports, comprising:

a pair of transistor means, each having a control terminal coupled to the input port, and two current-conducting terminals, one of the current-conducting terminals of each transistor means being coupled to a reference voltage, and the other current-conducting terminal of one transistor means being coupled to the first output port, and the other current-conducting terminal of the other transistor means being coupled to the second output port, whereby a signal input on one of the output ports is out of phase with the same signal passing through the two transistor means to the other output port; and impedance means coupling only the two output ports, thereby defining a signal path devoid of any other lumped impedance extending between the two output ports for feeding a signal of reduced amplitude between the first and second output ports having a phase generally opposite to that of the corresponding signal passing between the output ports through the two transistor means.

2. A splitter according to claim 1 wherein the impedance means comprises resistance means.

3. A splitter according to claim 2 wherein the impedance means further comprises reactance means.

4. A splitter according to claim 3 wherein the reactance means comprises inductance means in series with the resistance means.

5. An active power splitter for splitting power input on an input port between first and second output ports, comprising:

input inductance means coupled to the input port;

a first and a second FET means, the gate of each FET means being coupled to the input inductance means, the source of each FET means being coupled to ground potential, the drain of the first FET means being coupled to the first output port, and the drain of the second FET means being coupled to the second output port, whereby a signal input on the drain of one of the FET means is 180° out of phase with the same signal passing through the two FET means to the drain of the other FET means;

first and second impedance means coupling the gate and drain of the first and second FET means, respectively; and isolation resistance means coupled between the first and second output ports for feeding signals of reduced amplitude between the first and second output ports.

* * * * *